(12) United States Patent
Yen

(10) Patent No.: US 11,923,818 B2
(45) Date of Patent: Mar. 5, 2024

(54) INDUCTOR DEVICE

(71) Applicant: Realtek Semiconductor Corporation, Hsinchu (TW)

(72) Inventor: Hsiao-Tsung Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/558,789

(22) Filed: Dec. 22, 2021

(65) Prior Publication Data

US 2022/0239271 A1 Jul. 28, 2022

(30) Foreign Application Priority Data

Jan. 27, 2021 (TW) ................. 110103078

(51) Int. Cl.
*H03H 7/01* (2006.01)
*H01F 27/28* (2006.01)
*H01F 27/29* (2006.01)
*H01F 27/40* (2006.01)

(52) U.S. Cl.
CPC ............ *H03H 7/0115* (2013.01); *H01F 27/28* (2013.01); *H01F 27/2804* (2013.01); *H01F 27/29* (2013.01); *H01F 27/40* (2013.01)

(58) Field of Classification Search
CPC ....... H03H 7/0115; H01F 27/40; H01F 27/29; H01F 27/2804; H01F 27/28
USPC .................................................. 333/175, 185
See application file for complete search history.

(56) References Cited

U.S. PATENT DOCUMENTS

| 9,729,121 | B2 | 8/2017 | Tsai et al. |
| 9,775,269 | B2 | 9/2017 | Yen et al. |
| 2011/0260819 | A1* | 10/2011 | Yeh .................. H01F 21/02 336/155 |
| 2021/0074465 | A1 | 3/2021 | Yen et al. |
| 2021/0074466 | A1 | 3/2021 | Yen et al. |
| 2021/0074803 | A1 | 3/2021 | Yen et al. |

FOREIGN PATENT DOCUMENTS

| CN | 105720702 A | 6/2016 | |
| EP | 2037465 A1 * | 3/2009 | ......... H01F 17/0006 |
| TW | 201633338 A | 9/2016 | |

* cited by examiner

*Primary Examiner* — Rakesh B Patel
(74) *Attorney, Agent, or Firm* — Locke Lord LLP; Tim Tingkang Xia, Esq.

(57) ABSTRACT

An inductor device includes a first trace, a second trace, a first capacitor, and at least one connection element. The first trace includes at least two sub-traces. One terminal of the at least two sub-traces is coupled to a first node. The second trace includes at least two sub-traces. One terminal of the at least two sub-traces is coupled to a second node. The first capacitor is coupled between the first node and the second node. The at least one connection element is coupled to another terminal of the at least two sub-traces of the first trace and another terminal of the at least two sub-traces of the second trace, such that the first trace and the second trace form a closed loop.

20 Claims, 7 Drawing Sheets

INDUCTOR DEVICE

RELATED APPLICATIONS

This application claims priority to and the benefit of Taiwan Application Serial Number 110103078, filed on Jan. 27, 2021, the entire contents of which are incorporated herein by reference as if fully set forth below in its entirety and for all applicable purposes.

BACKGROUND

Field of Invention

The present disclosure relates to an electronic device. More particularly, the present disclosure relates to an inductor device.

Description of Related Art

Closed loops applied in conventional inductor devices will decrease inductance of inductor devices, and will affect quality factors (Q value) of inductor devices. If closed loops are disposed near elements in inductor devices, quality factors of inductor devices will be affected significantly.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

One aspect of the present disclosure is to provide an inductor device. The inductor device includes a first trace, a second trace, a first capacitor, and at least one connection element. The first trace includes at least two sub-traces. One terminal of the at least two sub-traces is coupled to a first node. The second trace includes at least two sub-traces. One terminal of the at least two sub-traces is coupled to a second node. The first capacitor is coupled between the first node and the second node. The at least one connection element is coupled to another terminal of the at least two sub-traces of the first trace and another terminal of the at least two sub-traces of the second trace, such that the first trace and the second trace form a closed loop.

Therefore, based on the technical content of the present disclosure, the capacitor of the inductor device brings a function to filter low frequency, such that low frequency signal induced at the inductor device cannot pass but high frequency signal can pass the capacitor directly. Low frequency signal is, for example, a signal that uses 2.4 GHz as main operating frequency. An induced signal caused by the main operating frequency can be cancelled by the folded inductor of the inductor device. Therefore, the folded inductor will not affect the characteristic of the operating frequency of the inductor. The signals which are induced in two traces of the folded inductor will be cancelled because the directions of the signals in the two traces are opposite to each other. If an inductor which is located at the center of the inductor device has a high frequency signal, for example, a second harmonic (i.e., 5 GHz signal), the high frequency signal may pass the capacitor and form an inductive inductor which is a circle flows through the folded inductor and the capacitor. Therefore, a 5 GHz harmonic signal, which is ten times as large as a 2.4 GHz harmonic signal, is induced in the inductor device of the present disclosure. The 5 GHz signal can be used in the circuit. For example, the 5 GHz signal can be amplified and then the amplified 5 GHz signal is used to cancel the 5 GHz harmonic signal of the operating frequency. The amplifying circuit can be arranged by a designer who is familiar with circuit design. As a result, a negative effect to a 5 GHz circuit can be reduced.

In addition, since the filter is disposed inside the inductor device of the present disclosure, there is no need to dispose a filter outside of the inductor device, so as to prevent an outer filter from affecting the circuit or prevent additional costs. Besides, the inductor device not only brings a function to filter low frequency (e.g., the second harmonic) by the capacitor, but also filters high frequency (e.g., the fourth harmonic) signals by the disposition of multiple capacitors in a short circuit manner so as to avoid negative effect generated by the fourth harmonic of an original circuit.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

Figure 1:
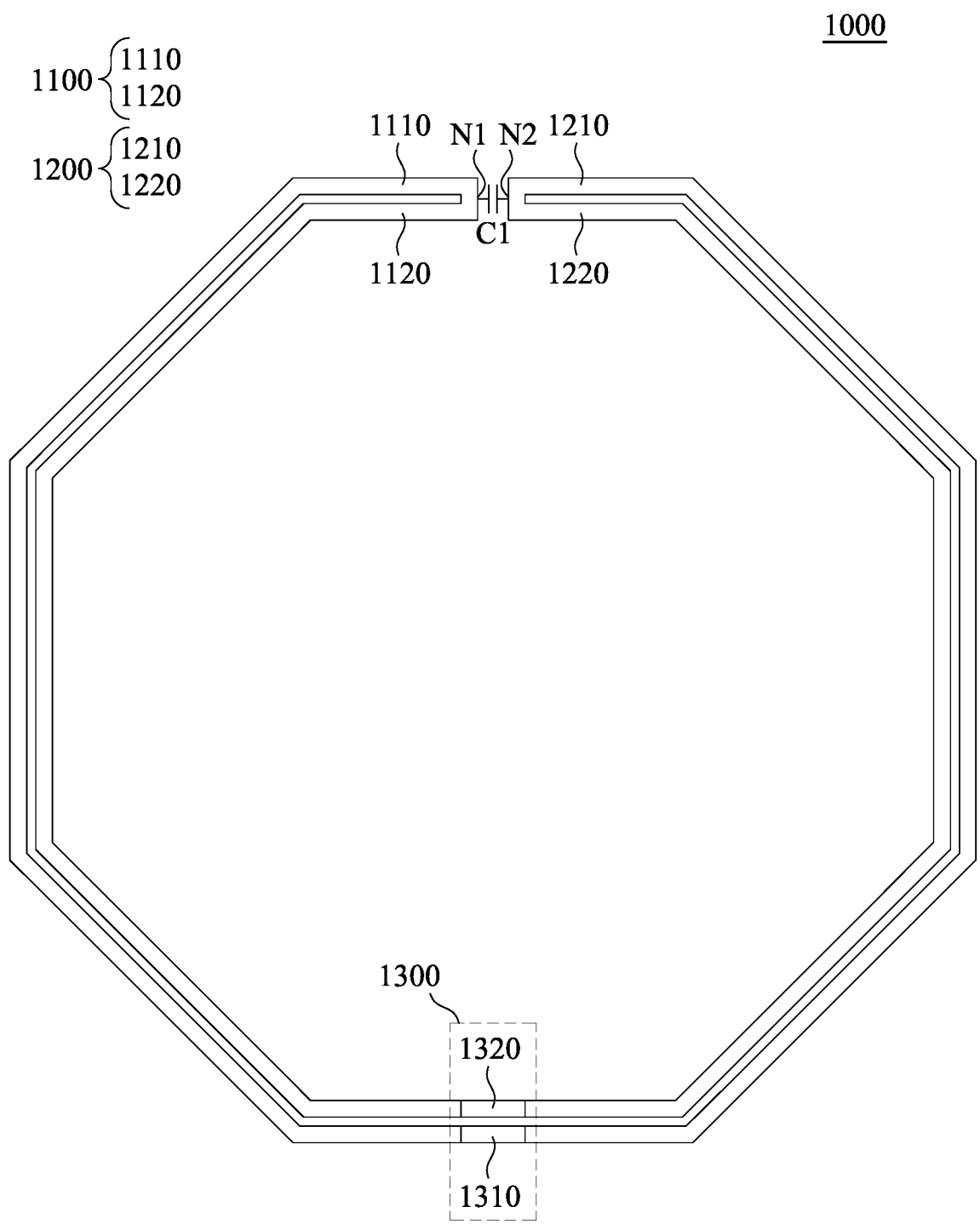
FIG. 1 depicts a schematic diagram of an inductor device according to one embodiment of the present disclosure.

FIG. 1 depicts a schematic diagram of an inductor device 1000 according to one embodiment of the present disclosure. For facilitating the understanding of the inductor device 1000 shown in FIG. 1, the structure of the inductor device 1000 in FIG. 1 is simplified as a schematic diagram of the inductor device 1000 in FIG. 2.

Figure 2:
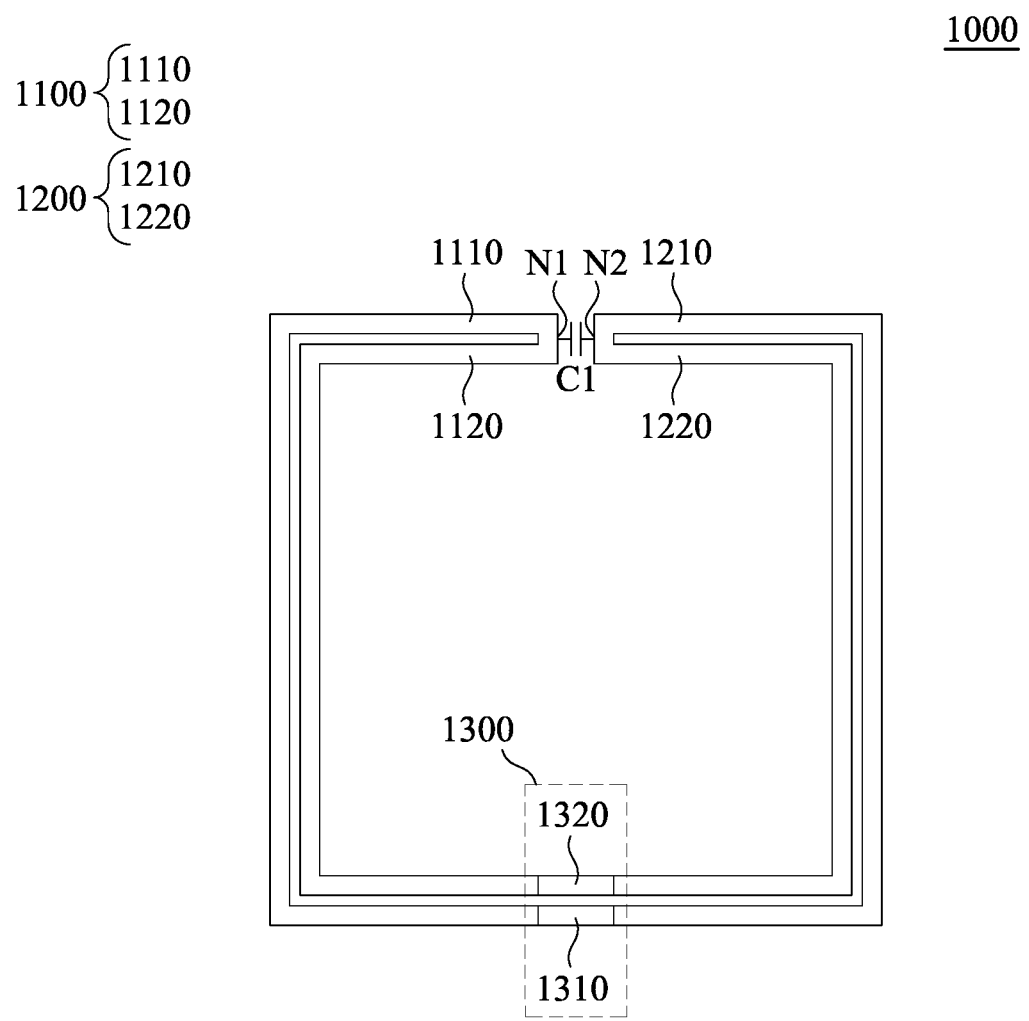
FIG. 2 depicts a schematic diagram of an inductor device according to one embodiment of the present disclosure.

Referring to both FIG. 1 and FIG. 2, the inductor device 1000 includes a first trace 1100, a second trace 1200, a capacitor C1, and at least one connection element 1300. In addition, the first trace 1100 includes at least two sub-traces 1110, 1120. The second trace 1200 includes at least two sub-traces 1210, 1220.

As shown in the figure, one terminal (e.g., the upper terminal) of the at least two sub-traces 1110, 1120 is coupled to the first node N1. One terminal (e.g., the upper terminal) of the at least two sub-traces 1210, 1220 is coupled to the second node N2. The capacitor C1 is coupled between the first node N1 and the second node N2. In addition, the at least one connection element 1300 is coupled to another terminal (e.g., the lower terminal) of the at least two sub-traces 1110, 1120 of the first trace 1100 and another terminal (e.g., the lower terminal) of the at least two sub-traces 1210, 1220 of the second trace 1200, such that the first trace 1100 and the second trace 1200 form a closed loop.

In one embodiment, the at least one connection element 1300 includes a first connection element 1310 and a second connection element 1320. The first connection element 1310 is coupled to another terminal (e.g., the lower terminal) of one (e.g., the sub-trace 1110) of the at least two sub-traces 1110, 1120 of the first trace 1100 and another terminal (e.g., the lower terminal) of one (e.g., the sub-trace 1210) of the at least two sub-traces 1210, 1220 of the second trace 1200. The second connection element 1320 is coupled to another terminal (e.g., the lower terminal) of another one (e.g., the sub-trace 1120) of the at least two sub-traces 1110, 1120 of the first trace 1100 and another terminal (e.g., the lower terminal) of another one (e.g., the sub-trace 1220) of the at least two sub-traces 1210, 1220 of the second trace 1200.

In one embodiment, each of the at least two sub-traces 1110, 1120 of the first trace 1100 includes a U-typed sub-trace. For example, the sub-traces 1110, 1120 are all U-typed sub-traces. In addition, each of the at least two sub-traces 1210, 1220 of the second trace 1200 also includes a U-typed sub-trace. For example, the sub-traces 1210, 1220 are all U-typed sub-traces. However, the present disclosure is not limited to the above-mentioned embodiments in FIG. 1 and FIG. 2, and it is merely an example for illustrating one of the implements of the present disclosure. It will be apparent to those skilled in the art that other suitable shape and other suitable disposition of the sub-trace can be used in the present disclosure without departing from the scope or spirit of the present disclosure.

In one embodiment, the first trace 1100 includes a first sub-trace 1110 and a second sub-trace 1120. Besides, each of the first sub-trace 1110 and the second sub-trace 1120 includes a first terminal and a second terminal. As shown in the figure, the first terminal (e.g., the upper terminal) of the first sub-trace 1110 and the first terminal (e.g., the upper terminal) of the second sub-trace 1120 are coupled at a first node N1. In addition, the second trace 1200 includes a third sub-trace 1210 and a fourth sub-trace 1220. Besides, each of the third sub-trace 1210 and the fourth sub-trace 1220 includes a first terminal and a second terminal. As shown in the figure, the first terminal (e.g., the upper terminal) of the third sub-trace 1210 and the first terminal (e.g., the upper terminal) of the fourth sub-trace 1220 are coupled at a second node N2.

In one embodiment, the first connection element 1310 is coupled to the second terminal (e.g., the lower terminal) of the first sub-trace 1110 and the second terminal (e.g., the lower terminal) of the third sub-trace 1210. In one embodiment, the second connection element 1320 is coupled to the second terminal (e.g., the lower terminal) of the second sub-trace 1120 and the second terminal (e.g., the lower terminal) of the fourth sub-trace 1220.

In one embodiment, the capacitor C1 and the first connection element 1310 are disposed at two sides of the inductor device 1000 respectively. For example, the capacitor C1 is disposed at the upper side of the inductor device 1000, and the first connection element 1300 is disposed at the lower side of the inductor device 1000.

In one embodiment, the capacitor C1 and the second connection element 1320 are disposed at two sides of the inductor device 1000 respectively. For example, the capacitor C1 is disposed at the upper side of the inductor device 1000, and the second connection element 1320 is disposed at the lower side of the inductor device 1000. In one embodiment, the first connection element 1310 and the second connection element 1320 are disposed at the same side of the inductor device 1000. For example, the first connection element 1310 and the second connection element 1320 are all disposed at the lower side of the inductor device 1000. It is noted that the present disclosure is not limited to the structure as shown in FIG. 1 and FIG. 2, and it is merely an example for illustrating one of the implements of the present disclosure.

Figure 3:
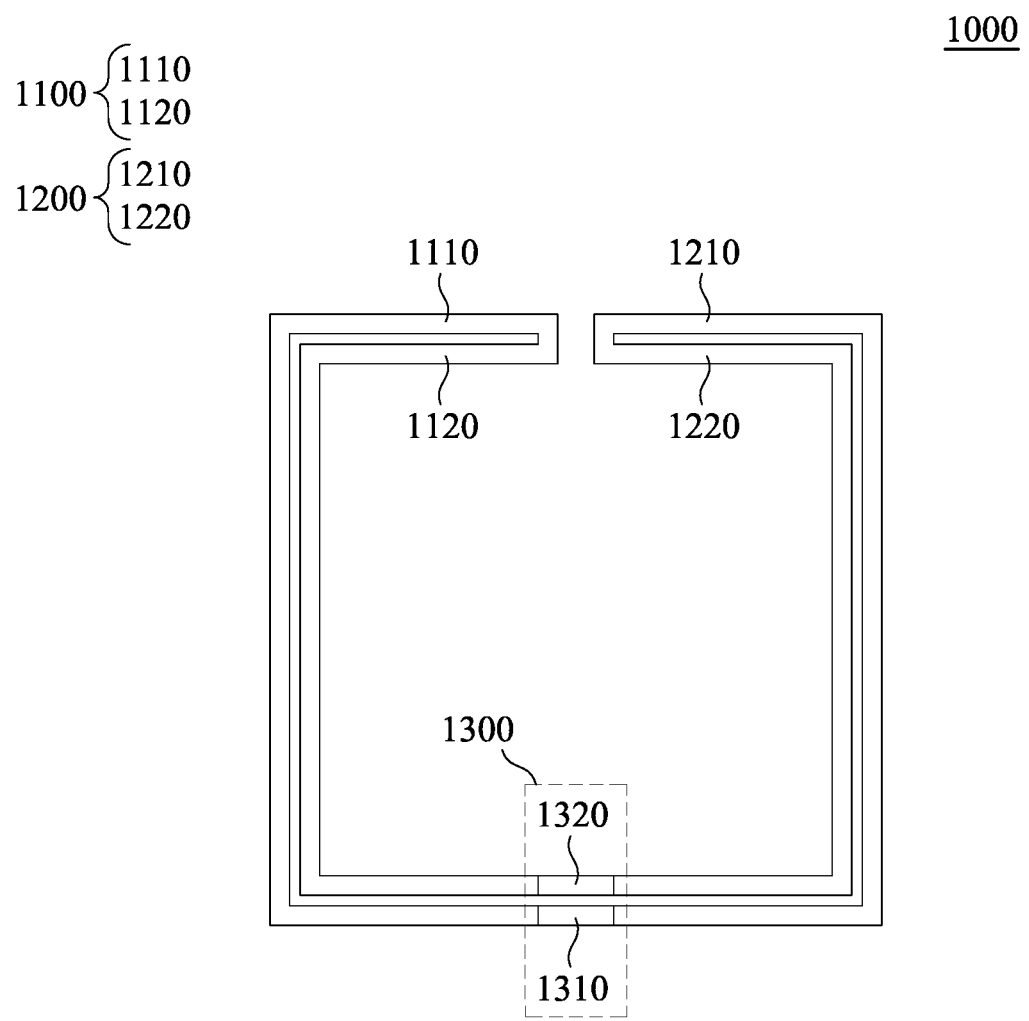
FIG. 3 depicts a schematic operation diagram of the inductor device shown in FIG. 2 according to one embodiment of the present disclosure.

FIG. 3 depicts a schematic operation diagram of the inductor device 1000 shown in FIG. 2 according to one embodiment of the present disclosure. Firstly, reference is now made to FIG. 2. If the inductor device 1000 operates at low frequency, the portion which disposed the capacitor C1 forms an open circuit as shown in FIG. 3. Therefore, the capacitor C1 of the inductor device 1000 of the embodiment of the present disclosure brings a function to filter low frequency, such that low frequency signal induced at the inductor device 1000 cannot pass.

Figure 4:
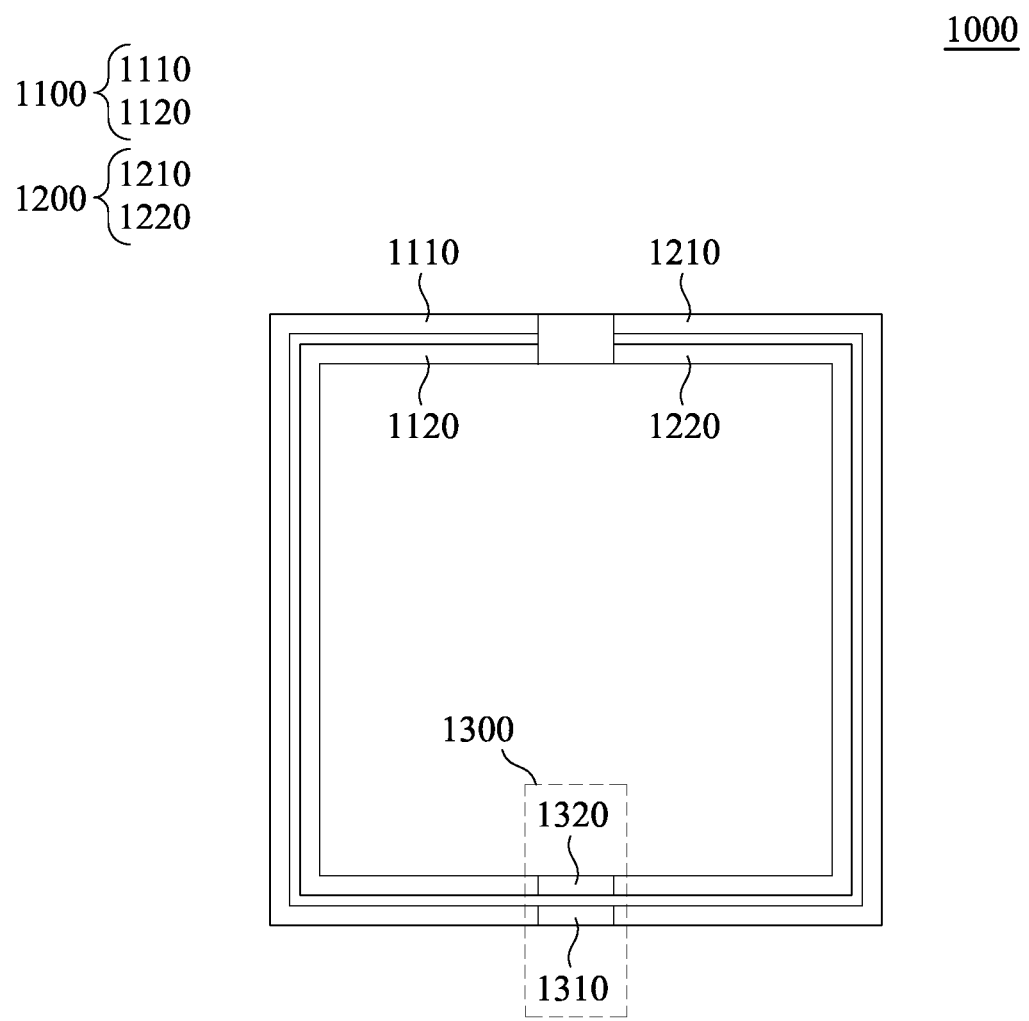
FIG. 4 depicts a schematic operation diagram of the inductor device shown in FIG. 2 according to one embodiment of the present disclosure.

FIG. 4 depicts a schematic operation diagram of the inductor device 1000 shown in FIG. 2 according to one embodiment of the present disclosure. Firstly, reference is now made to FIG. 2. If the inductor device 1000 operates at high frequency, the portion which disposed the capacitor C1 forms a short circuit as shown in FIG. 4, such that high frequency signal can pass the capacitor directly. In one embodiment, inductors can be disposed inside the inductor device 1000 shown in FIG. 1 to FIG. 4.

Figure 5:
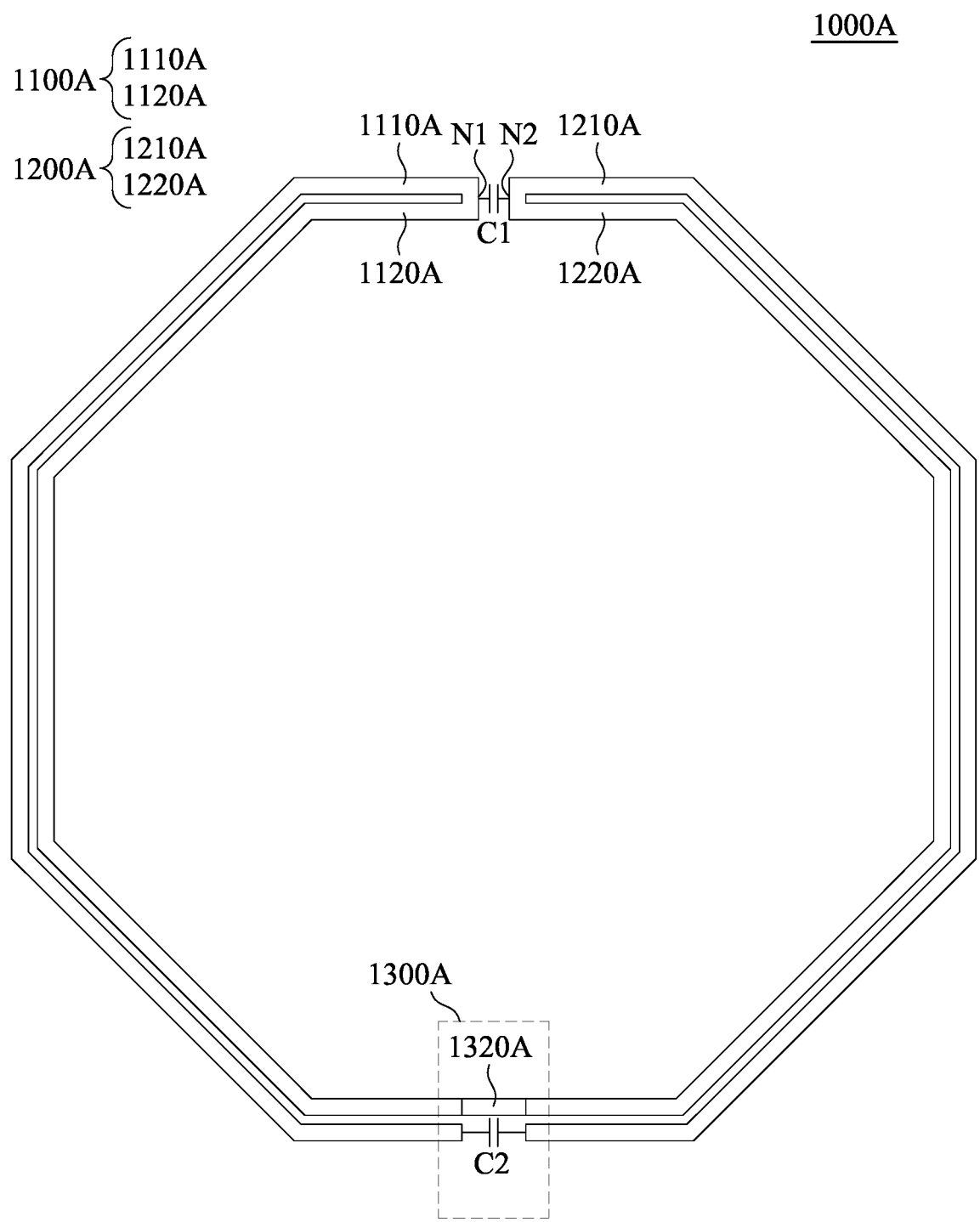
FIG. 5 depicts a schematic diagram of an inductor device according to one embodiment of the present disclosure.

FIG. 5 depicts a schematic diagram of an inductor device 1000A according to one embodiment of the present disclosure. For facilitating the understanding of the inductor device 1000A shown in FIG. 5, the structure of the inductor device 1000A in FIG. 5 is simplified as a schematic diagram of the inductor device 1000A in FIG. 6. Compared with the inductor device 1000 shown in FIG. 2, the connection element 1300A of the inductor device1000A in FIG. 6 can be implemented by a capacitor.

As shown in the figure, the connection element 1300A of the inductor device 1000A includes a capacitor C2. The capacitor C2 is coupled to the second terminal (e.g., the lower terminal) of the first sub-trace 1110A and the second terminal (e.g., the lower terminal) of the third sub-trace 1210A. In addition, the connection element 1300A of the inductor device 1000A further includes a connection element 1320A, and the connection element 1320A is coupled to the second terminal (e.g., the lower terminal) of the second sub-trace 1120A and the second terminal (e.g., the lower terminal) of the fourth sub-trace 1220A.

In one embodiment, the capacitor C1 and the capacitor C2 are disposed at two sides of the inductor device 1000A respectively. For example, the capacitor C1 is disposed at the upper side of the inductor device 1000A, and the capacitor C2 is disposed at the lower side of the inductor device 1000A.

In one embodiment, the capacitor C1 and the connection element 1320A are disposed at two sides of the inductor device 1000A respectively. For example, the capacitor C1 is disposed at the upper side of the inductor device 1000A, and the connection element 1320A is disposed at the lower side of the inductor device 1000A. In one embodiment, the connection element 1320A and the capacitor C2 are disposed at the same side. For example, the connection element 1320A and the capacitor C2 are all disposed at the lower side of the inductor device1000A. In one embodiment, inductors can be disposed inside the inductor device 1000A shown in FIG. 5 and FIG. 6. It is noted that the present disclosure is not limited to the structure as shown in FIG. 5 and FIG. 6, and it is merely an example for illustrating one of the implements of the present disclosure.

In one embodiment, the capacitance of the capacitor C1 is different from the capacitance of the capacitor C2. For example, the capacitance of the capacitor C1 is larger than the capacitance of the capacitor C2. In one embodiment, according to the frequency level (high or low) of the induced signal of the inductor device 1000A, the capacitor C1 and the capacitor C2 of the inductor device 1000A can be open circuit or short circuit at the same time, or one of the capacitor C1 and the capacitor C2 is open circuit and the other is short circuit. However, the present disclosure is not limited to the above-mentioned embodiments in FIG. 5 and FIG. 6, and it is merely an example for illustrating one of the implements of the present disclosure. It will be apparent to those skilled in the art that the capacitance of the capacitor C2 larger than the capacitance of the capacitor C1 or other suitable disposition can be used in the present disclosure without departing from the scope or spirit of the present disclosure.

Figure 6:
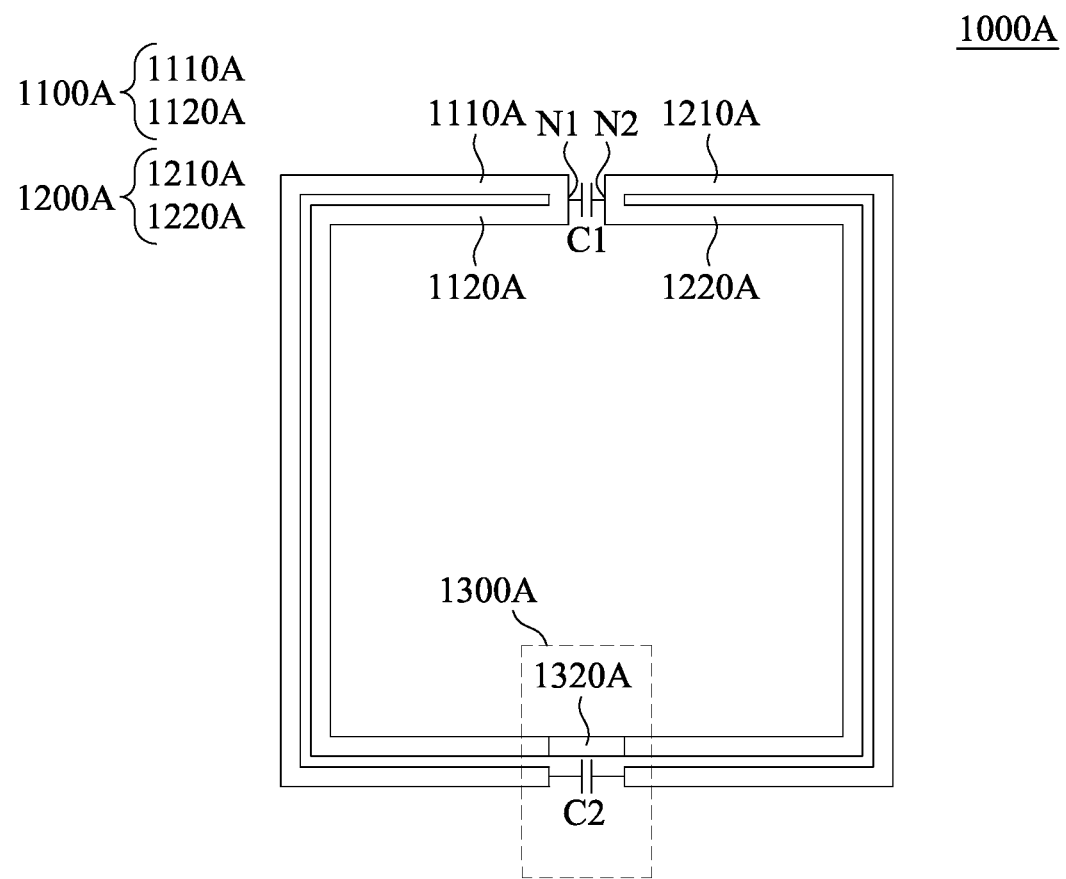
FIG. 6 depicts a schematic diagram of an inductor device according to one embodiment of the present disclosure.

It is noted that, the element in FIG. 5 and FIG. 6, whose symbol is similar to the symbol of the element in FIG. 1 and FIG. 2, has similar structure feature in connection with the element in FIG. 1 and FIG. 2. Therefore, a detail description regarding the structure feature of the element in FIG. 5 and FIG. 6 is omitted herein for the sake of brevity. Besides, the present disclosure is not limited to the structure as shown in FIG. 5 and FIG. 6, and it is merely an example for illustrating one of the implements of the present disclosure.

Figure 7:
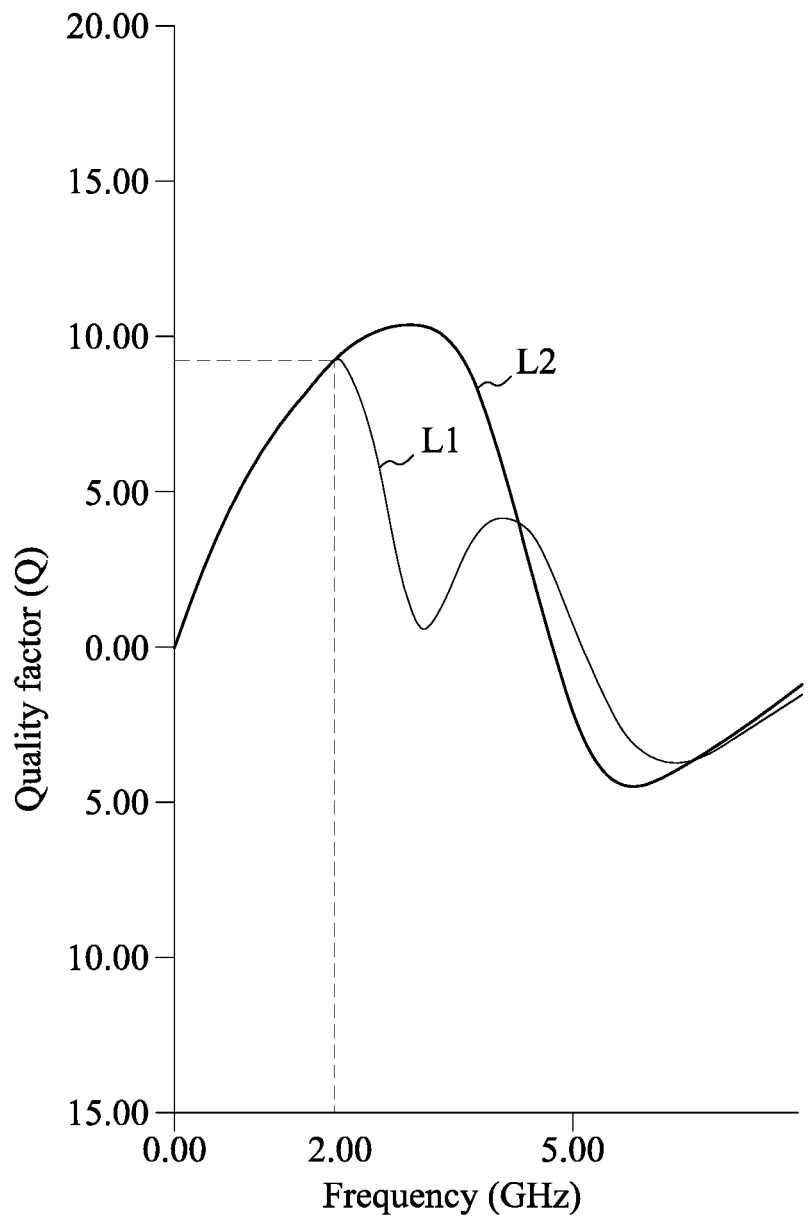
FIG. 7 depicts a schematic diagram of experimental data of an inductor device according to one embodiment of the present disclosure.

FIG. 7 depicts a schematic diagram of experimental data of an inductor device according to one embodiment of the present disclosure. As shown in the figure, the experimental curve of the quality factor of the inductor disposed in the inductor device 1000, 1000A adopting the structural configuration of the present disclosure is L1. In addition, the experimental curve of the quality factor of the inductor not adopting the structural configuration of the present disclosure is L2. As can be seen from the figure, at a frequency of about 2 GHz, the quality factor of the inductor device adopting the structural configuration of the present disclosure is about 9, which is near the quality factor of the inductor device not adopting the structural configuration of the present disclosure. It is noted that, even if the inductor is disposed in the inductor device 1000, 1000A adopting the structural configuration of the present disclosure, the quality factor of the inductor seems not to be affected. Besides, at a frequency of about 4 GHz, the inductor devices 1000, 1000A of the present disclosure form short circuit so as to reduce coupling effect. In addition, the harmonic frequency of the inductor device adopting the structural configuration of the present disclosure improves 3 dB.

It can be understood from the embodiments of the present disclosure that application of the present disclosure has the following advantages. The inductor device of the present disclosure may induce high frequency signal (e.g., second harmonic) of inductor inside the inductor device. After the high frequency signal is amplified by additional circuit, the amplified high frequency signal is able to cancel negative effect to the circuit caused by second harmonic. For example, the capacitor of the inductor device is used to let high frequency signal pass and block low frequency signal. Therefore, the inductor device is able to deal with signals in high frequency or low frequency by two kinds of inducing manner.

In addition, since the filter is disposed inside the integrated circuit (IC) of the present disclosure, there is no need to dispose a filter outside of the inductor device, so as to prevent an outer filter from affecting the circuit or prevent additional costs. Besides, the inductor device not only brings a function to filter low frequency (e.g., the second harmonic) by the capacitor, but also filters high frequency (e.g., the fourth harmonic) signals by the disposition of multiple capacitors in a short circuit manner so as to avoid negative effect generated by the fourth harmonic of an original circuit.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inductor device, comprising:
   a first trace, comprising:
      at least two sub-traces, wherein one terminal of the at least two sub-traces is coupled to a first node;
   a second trace, comprising:
      at least two sub-traces, wherein one terminal of the at least two sub-traces is coupled to a second node;
   a first capacitor, coupled between the first node and the second node; and
   at least one connection element, coupled to another terminal of the at least two sub-traces of the first trace and another terminal of the at least two sub-traces of the second trace, such that the first trace and the second trace form a closed loop;

wherein the at least two sub-traces of the first trace are disposed at a first side and are not disposed at a second side opposite to the first side, wherein the at least two sub-traces of the second trace are disposed at the second side and are not disposed at the first side.

2. The inductor device of claim 1, wherein the at least one connection element comprises:
a first connection element, coupled to another terminal of one of the at least two sub-traces of the first trace and another terminal of one of the at least two sub-traces of the second trace; and
a second connection element, coupled to another terminal of another one of the at least two sub-traces of the first trace and another terminal of another one of the at least two sub-traces of the second trace.

3. The inductor device of claim 2, wherein the at least two sub-traces of the first trace comprise:
a first sub-trace, comprising:
a first terminal; and
a second terminal; and
a second sub-trace, comprising:
a first terminal, coupled to the first terminal of the first sub-trace; and
a second terminal.

4. The inductor device of claim 3, wherein the at least two sub-traces of the second trace comprise:
a third sub-trace, comprising:
a first terminal; and
a second terminal; and
a fourth sub-trace, comprising:
a first terminal, coupled to the first terminal of the third sub-trace; and
a second terminal.

5. The inductor device of claim 4, wherein the first connection element is coupled to the second terminal of the first sub-trace and the second terminal of the third sub-trace.

6. The inductor device of claim 5, wherein the second connection element is coupled to the second terminal of the second sub-trace and the second terminal of the fourth sub-trace.

7. The inductor device of claim 6, wherein the first capacitor and the first connection element are disposed at two sides of the inductor device respectively.

8. The inductor device of claim 7, wherein the first capacitor and the second connection element are disposed at two sides of the inductor device respectively.

9. The inductor device of claim 8, wherein the first connection element and the second connection element are disposed at a same side of the inductor device.

10. The inductor device of claim 1, wherein the at least one connection element comprises a second capacitor.

11. The inductor device of claim 10, wherein the at least two sub-traces of the first trace comprise:
a first sub-trace, comprising:
a first terminal; and
a second terminal; and
a second sub-trace, comprising:
a first terminal, coupled to the first terminal of the first sub-trace; and
a second terminal.

12. The inductor device of claim 11, wherein the at least two sub-traces of the second trace comprise:
a third sub-trace, comprising:
a first terminal; and
a second terminal; and
a fourth sub-trace, comprising:
a first terminal, coupled to the first terminal of the third sub-trace; and
a second terminal.

13. The inductor device of claim 12, wherein the second capacitor is coupled to the second terminal of the first sub-trace and the second terminal of the third sub-trace.

14. The inductor device of claim 13, wherein the at least one connection element comprises:
a connection element, coupled to the second terminal of the second sub-trace and the second terminal of the fourth sub-trace.

15. The inductor device of claim 14, wherein the first capacitor and the second capacitor are disposed at two sides of the inductor device respectively.

16. The inductor device of claim 15, wherein the first capacitor and the connection element are disposed at two sides of the inductor device respectively.

17. The inductor device of claim 16, wherein the second capacitor and the connection element are disposed at a same side of the inductor device.

18. The inductor device of claim 10, wherein a first capacitance of the first capacitor is different from a second capacitance of the second capacitor.

19. The inductor device of claim 18, wherein the first capacitance of the first capacitor is larger than the second capacitance of the second capacitor.

20. The inductor device of claim 1, wherein one of the at least two sub-traces of the first trace comprises a U-typed sub-trace, wherein one of the at least two sub-traces of the second trace comprises a U-typed sub-trace.

* * * * *